(12) United States Patent
Liu et al.

(10) Patent No.: US 11,823,917 B2
(45) Date of Patent: Nov. 21, 2023

(54) SPRAY DEVICE AND CLEANING APPARATUS

(71) Applicant: BEIJING NAURA MICROELECTRONICS EQUIPMENT CO., LTD., Beijing (CN)

(72) Inventors: Wei Liu, Beijing (CN); Jie Chen, Beijing (CN); Xiaoyan Liu, Beijing (CN); Yi Wu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 220 days.

(21) Appl. No.: 17/224,714

(22) Filed: Apr. 7, 2021

(65) Prior Publication Data
US 2021/0225668 A1    Jul. 22, 2021

Related U.S. Application Data

(63) Continuation of application No. PCT/CN2019/108137, filed on Sep. 26, 2019.

(30) Foreign Application Priority Data

Oct. 18, 2018    (CN) .......................... 201811215275.1

(51) Int. Cl.
*H01L 21/67*    (2006.01)
*B08B 3/02*    (2006.01)
(Continued)

(52) U.S. Cl.
CPC .......... *H01L 21/67051* (2013.01); *B05B 7/26* (2013.01); *B05B 12/1472* (2013.01);
(Continued)

(58) Field of Classification Search
CPC .......... B08B 3/022; B08B 3/02; B08B 3/024; B05B 13/0405; B05B 1/18;
(Continued)

(56) References Cited

U.S. PATENT DOCUMENTS 9,796,000 B2 * 10/2017 Beck ................. H01L 21/67051
2003/0079764 A1 * 5/2003 Hirose .............. H01L 21/67051
134/144
(Continued)

FOREIGN PATENT DOCUMENTS

CN     203800020 U    8/2014
CN     205211718 U    5/2016
(Continued)

OTHER PUBLICATIONS

World Intellectual Property Organization (WIPO) International Search Report for PCT/CN2019/108137 dated Jan. 2, 2020 6 Pages.

*Primary Examiner* — Benjamin L Osterhout
(74) *Attorney, Agent, or Firm* — ANOVA LAW GROUP, PLLC

(57) ABSTRACT

A spray device includes a spray assembly. The spray assembly is configured to spray cleaning liquid towards a to-be-cleaned surface of a to-be-processed workpiece. The spray assembly includes a spray head and multiple liquid inlet pipelines. The spray assembly is configured to spray cleaning liquids with different concentrations, temperatures, and/or flow rates corresponding to different positions in a radial direction of the to-be-cleaned surface to cause a cleaning rate of the cleaning liquids at the different positions in the radial direction of the to-be-cleaned surface to be consistent.

20 Claims, 3 Drawing Sheets

(51) Int. Cl.
*B05B 7/26* (2006.01)
*B05B 13/04* (2006.01)
*B05B 13/02* (2006.01)
*B05B 12/14* (2006.01)
B05B 12/04 (2006.01)

(52) U.S. Cl.
CPC .......... *B05B 13/0228* (2013.01); *B05B 13/04* (2013.01); *B05B 13/0405* (2013.01); *B08B 3/02* (2013.01); *B08B 3/022* (2013.01); *B08B 3/024* (2013.01); *H01L 21/67253* (2013.01); *B05B 12/04* (2013.01); *B05B 12/1418* (2013.01)

(58) Field of Classification Search
CPC ... B05B 13/0228; B05B 7/26; B05B 12/1472; B05B 3/04; B05B 12/04; B05B 12/1418; H01L 21/67051; H01L 21/67253
See application file for complete search history.

(56) References Cited

U.S. PATENT DOCUMENTS

| | | | |
|---|---|---|---|
| 2005/0067000 A1* | 3/2005 | Kosugi | B08B 3/02 134/25.4 |
| 2005/0276921 A1* | 12/2005 | Miya | H01L 21/6875 |
| 2006/0021636 A1* | 2/2006 | Miya | B08B 3/04 134/144 |
| 2008/0314870 A1* | 12/2008 | Inoue | B08B 1/04 118/58 |
| 2011/0139188 A1* | 6/2011 | Tsai | B08B 3/04 134/26 |
| 2011/0180113 A1* | 7/2011 | Chien | H01L 21/67051 134/32 |
| 2015/0114560 A1* | 4/2015 | Inoue | H01L 21/67253 156/345.21 |

FOREIGN PATENT DOCUMENTS

| | | |
|---|---|---|
| CN | 207637755 U | 7/2018 |
| KR | 20060088974 A | 8/2006 |
| TW | 201703128 A | 1/2017 |
| TW | 201803218 A | 1/2018 |

* cited by examiner

SPRAY DEVICE AND CLEANING APPARATUS

CROSS-REFERENCES TO RELATED APPLICATIONS

This application is a continuation of International Application No. PCT/CN2019/108137, filed on Sep. 26, 2019, which claims priority to Chinese Application No. 201811215275.1 filed on Oct. 18, 2018, the entire content of all of which are incorporated herein by reference.

TECHNICAL FIELD

The present disclosure generally relates to the semiconductor manufacturing field and, more particularly, to a spray device and a cleaning apparatus.

BACKGROUND

As a feature size of an integrated circuit continues to shrink, higher and higher requirements are imposed on cleanliness and flatness of a wafer surface oxide film. For example, an excessive thickness of the wafer surface oxide film directly affects the quality of the subsequent process. Thus, the performance of the integrated circuit chip becomes worse, and the product yield rate decreases.

A monolithic wet etching technology becomes a very important technology to improve uniformity of a film thickness due to its advantages of non-cross-contamination and regional corrosion. However, with a wafer size continues to increase, precisely controlling the rate and uniformity of the monolithic wet etching becomes more and more challenging.

Factors, such as concentration, temperature, and flow rate of a corrosion solution are all important factors that affect a chemical reaction rate. However, during the process, an edge linear velocity is much greater than a center linear velocity for a rotating wafer. When a chemical liquid is sprayed evenly and vertically on the wafer surface, a thickness of a liquid film in the edge area of the wafer surface is smaller than the thickness of the liquid film in the center area. Thus, the thickness of the liquid film is not uniform in the radial direction of the wafer. Meanwhile, since the thickness of the liquid film in the edge area of the wafer surface is too small, an etching rate is slow, and bumps are easily formed, which affects the product yield.

SUMMARY

Embodiments of the present disclosure provide a spray device including a spray assembly. The spray assembly is configured to spray cleaning liquid towards a to-be-cleaned surface of a to-be-processed workpiece. The spray assembly includes a spray head and multiple liquid inlet pipelines. The spray assembly is configured to spray cleaning liquids with different concentrations, temperatures, and/or flow rates corresponding to different positions in a radial direction of the to-be-cleaned surface to cause a cleaning rate of the cleaning liquids at the different positions in the radial direction of the to-be-cleaned surface to be consistent.

Embodiments of the present disclosure provide a cleaning apparatus including a carrier and a spray device. The carrier is configured to carry a to-be-processed workpiece. The spray device is configured to clean a to-be-cleaned surface of the to-be-processed workpiece. The spray device includes a spray assembly. The spray assembly is configured to spray cleaning liquid towards the to-be-cleaned surface of the to-be-processed workpiece. The spray assembly includes a spray head and multiple liquid inlet pipelines. The spray assembly is configured to spray cleaning liquids with different concentrations, temperatures, and/or flow rates corresponding to different positions in a radial direction of the to-be-cleaned surface to cause a cleaning rate of the cleaning liquids at the different positions in the radial direction of the to-be-cleaned surface to be consistent.

DETAILED DESCRIPTION OF THE EMBODIMENTS

Figure 1:
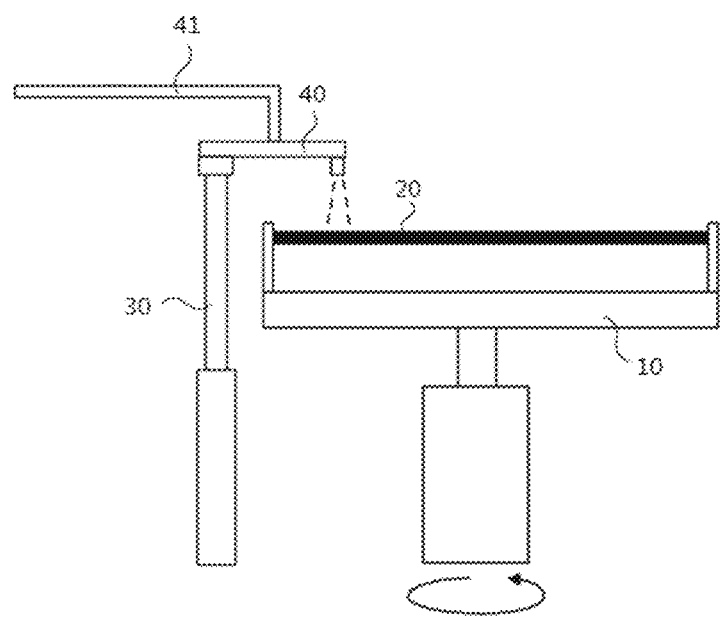
FIG. 1 illustrates a schematic structural diagram of a spray device according to some embodiments of the present disclosure.

To make those of ordinary skill in the art to better understand the technical solutions of the present disclosure, a spray device and a cleaning apparatus provided by the present disclosure are described in detail below in connection with the accompanying drawings.

The present disclosure provides a spray device, which includes a spray assembly. The spray assembly may be configured to spray cleaning liquid towards a surface of a to-be-processed workpiece. The cleaning liquid usually includes chemical liquid, which may chemically react with substances of a to-be-cleaned surface of the to-be-processed workpiece. Thus, an unnecessary oxide film or another film layer of the to-be-cleaned surface may be etched off. In practical applications, to ensure the uniformity of the process, the to-be-processed workpiece needs to rotate. However, an edge linear velocity is much greater than a center linear velocity for the rotating wafer. When the chemical liquid is uniformly and vertically sprayed on the wafer surface, the thickness of the liquid film in the edge area of the wafer surface may be smaller than the thickness of the liquid film in the center area. Thus, the liquid film thickness may not be uniform in the radial direction of the wafer. Meanwhile, since the thickness of the liquid film in the edge area of the wafer surface is too small, the etching rate may be slow, bumps may be easily formed, which may affect the product yield.

To solve the above-mentioned problems, the present disclosure provides a spray assembly. The spray assembly may be configured to spray cleaning liquids with different concentrations, temperatures, and/or flow rates corresponding to different positions in the radial direction of the to-be-cleaned surface. The concentration, the temperature, and the flow rate are all important factors affecting the chemical reaction rate. In some embodiments, the higher the concentration or the temperature of the cleaning liquid is, the greater the thickness of the liquid film sprayed on the to-be-cleaned surface is. On the contrary, the lower the concentration or the temperature of the cleaning liquid is, the less the thickness of the liquid film sprayed on the to-be-cleaned surface is. The greater the flow rate of the cleaning liquid is, the greater the thickness of the liquid film sprayed on the to-be-cleaned surface is. On the contrary, the less the flow rate of the cleaning liquid is, the less the thickness of the liquid film sprayed on the to-be-cleaned surface is. As such, with the help of the spray assembly spraying the cleaning liquids with different concentrations, temperatures, and/or flow rates corresponding to different positions in the radial direction of the to-be-cleaned surface, the cleaning rates of the cleaning liquids at different positions in the radial direction of the to-be-cleaned surface may be consistent. Thus, the uniformity of cleaning may be improved, and meanwhile, the bumps, which are formed because the thickness of the liquid film is too thin, may be avoided. Therefore, the product yield may be improved. In addition, since changes in the concentration, the temperature, and/or the flow rate of the cleaning liquid impact the cleaning rate greatly, the feedback rate may be increased.

Embodiments the present disclosure provide a spray assembly. In some embodiments, referring to FIG. 1 and FIG. 2, the spray assembly provided by embodiments of the present disclosure includes a spray head 40, multiple liquid inlet pipelines 41, and a drive source 30. The spray head 40 may be configured to spray cleaning liquid(s) to a to-be-cleaned surface 21 of a to-be-processed workpiece 20. The drive source 30 may be configured to drive the spray head 40 to move back and forth between an edge and a center of the to-be-cleaned surface 21 when the to-be-processed workpiece rotates. As such, the spray head 40 can spray the cleaning liquids to cover the entire to-be-cleaned surface 21. The multiple liquid inlet pipelines 41 may be configured to provide the cleaning liquids to the spray head 40. An on/off valve may be arranged in each of the multiple liquid inlet pipelines 41. Moreover, during movement of the spray head 40, an order of opening the on/off valves to open corresponding liquid inlet pipelines and/or a number of times of switching (e.g., to open) the on/off valves of corresponding liquid inlet pipelines may be controlled according to a predetermined rule. Thus, the spray assembly may spray the cleaning liquids with different concentrations, temperatures, and/or flow rates corresponding to different positions in the radial direction of the to-be-cleaned surface.

As such, the cleaning rates of the cleaning liquids at different positions in the radial direction of the to-be-cleaned surface 21 may be consistent. Meanwhile, different liquid inlet pipelines 41 may be switched by instantly open and close the on/off valves. Thus, a time delay of the changes in the concentration and/or temperature of the cleaning liquid sprayed from the spray head may be reduced. As such, the uniformity of the concentration and/or temperature of the cleaning liquid in the radial direction of the to-be-cleaned surface may be accurately controlled. Thus, the etching rate may be controlled precisely to improve the uniformity of the etching of the wafer.

In some embodiments, a drive source 30 may be a rotary drive source and configured to drive the spray head 40 to swing back and forth between the edge and the center of the to-be-cleaned surface 21. In some embodiments, the rotary drive source includes a drive arm and a rotation motor. The drive arm is vertically arranged on a side of a carrier 10 for carrying the to-be-processed workpiece 20. The spray head 40 is arranged on the drive arm and is located over the carrier 10. The rotation motor may be configured to drive the drive arm to rotate a predetermined angle clockwise or counterclockwise.

Figure 2:
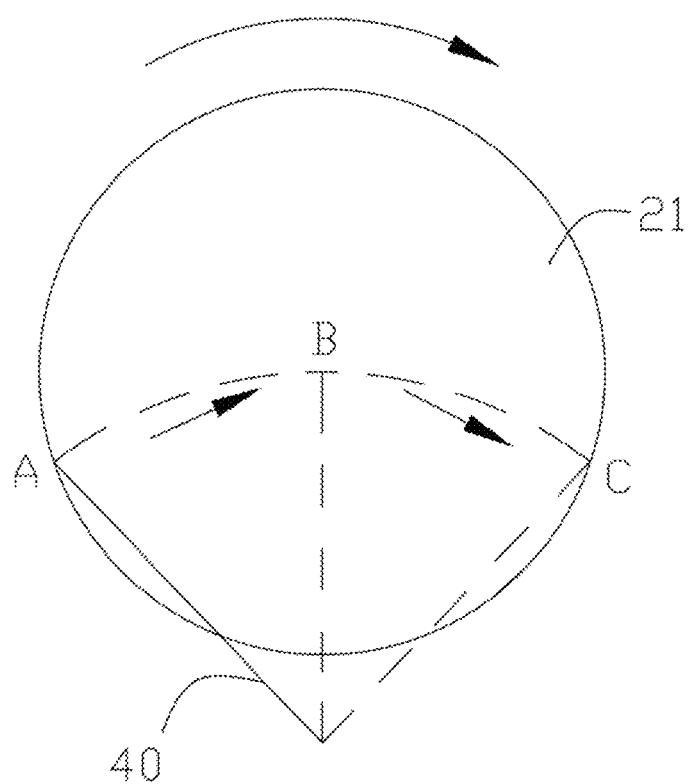
FIG. 2 illustrates a schematic principle diagram of a spray device according to some embodiments of the present disclosure.

For example, as shown in FIG. 2, driven by the rotation motor, the drive arm drives the spray head 40 to rotate a predetermined angle clockwise from an edge A of the to-be-cleaned surface 21 to the center B of the to-be-cleaned surface 21. Then, the spray head 40 rotates a predetermined angle clockwise from the center B to another edge C of the to-be-cleaned surface 21. Subsequently, the drive arm drives the spray head 40 to rotate the predetermined angle counterclockwise from the edge C reversely to the center B. Then, the spray head 40 rotates the predetermined angle counterclockwise from the center B to return to the edge A. As the spray head 40 moves repeatedly as described above, with the cooperation of the rotation movement of the to-be-processed workpiece 20, the cleaning liquid can cover the entire to-be-cleaned surface. Meanwhile, the spray head 40 may swing back and forth between the edge and the center of the to-be-cleaned surface 21.

In practical applications, the drive arm may also use another rotation path, as long as the cleaning liquid can cover the entire to-be-cleaned surface, and the spray head 40 can swing back and forth between the edge and the center of the to-be-cleaned surface 21. In some embodiments, a linear drive source may be used instead of the above-mentioned rotary drive source. Under this situation, the linear drive source may be configured to drive the spray head 40 to move back and forth linearly along the radial direction of the to-be-cleaned surface. Thus, the cleaning liquid can also cover the entire to-be-cleaned surface. Meanwhile, the spray head 40 may swing back and forth between the edge and the center of the to-be-cleaned surface.

Figure 3:
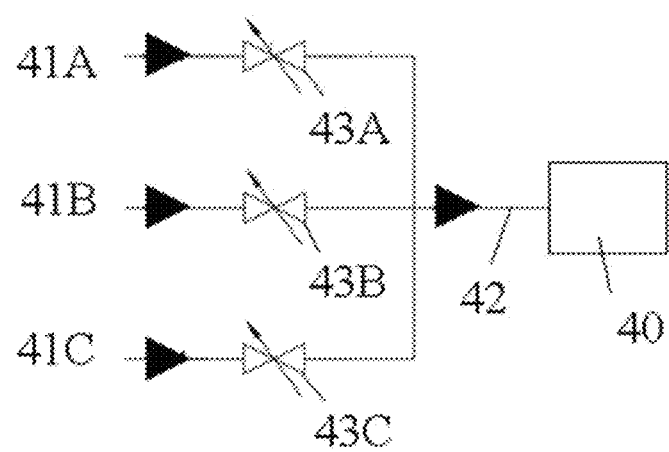
FIG. 3 illustrates a schematic structural diagram of a liquid inlet pipeline according to some embodiments of the present disclosure.
Figure 4:
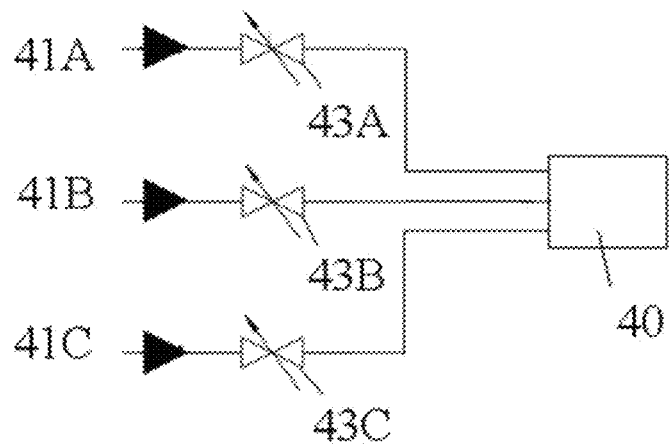
FIG. 4 illustrates another schematic structural diagram of a liquid inlet pipeline according to some embodiments of the present disclosure.

In some embodiments, as shown in FIG. 3, the spray assembly also includes a main liquid inlet pipeline 42. The liquid outlet ends of the multiple liquid inlet pipelines 41 are connected to a liquid inlet end of the main liquid inlet pipeline 42. A liquid outlet end of the main liquid inlet pipeline 42 is connected to the spray head 40. In practical applications, the multiple liquid inlet pipelines 41 may also be separate from each other. As shown in FIG. 4, the liquid outlet ends of the multiple liquid inlet pipelines 41 are directly connected to the spray head 40.

In some embodiments, the cleaning liquids provided to the multiple liquid inlet pipelines 41 may have different concentrations and/or temperatures. The multiple liquid inlet pipelines 41 are configured to transfer the cleaning liquids with different concentrations and/or temperatures. When the spray head 40 rotates back and forth between the edge and the center of the to-be-cleaned surface 21, by opening the on/off valves according to a predetermined order, the liquid inlet pipelines 41 may provide the cleaning liquids with different concentrations and/or temperatures to the spray head 40. Thus, the spray head 40 may spray the cleaning liquids with different concentrations and/or temperatures corresponding to different positions in the radial direction of the to-be-cleaned surface. Therefore, the cleaning rate of the cleaning liquid at different positions in the radial direction of the to-be-cleaned surface may be consistent.

In some embodiments, the predetermined order may be as follows. When the spray head 40 moves back and forth from the edge of the to-be-cleaned surface 21 to the center by the drive source 30, the corresponding on/off valves of the liquid inlet pipelines 41 may be sequentially opened according to the concentrations and/or the temperatures in an order of from high to low. An opening of an on/off valve of only one of the multiple liquid inlet pipelines 41 may be always maintained. In other words, when the spray head 40 moves back and forth from the edge to the center of the to-be-cleaned surface 21, only one liquid inlet pipeline 41 provides the cleaning liquid to the spray head 40. The changes in the concentration and/or the temperature may be achieved by switching different liquid inlet pipelines 41.

Thus, the concentration and/or temperature of the cleaning liquid may be reduced from the edge to the center of the to-be-cleaned surface 21, such that a difference in the liquid film thickness of the to-be-processed workpiece generated due to a difference in the linear velocity in the radial direction may be compensated. Therefore, the thickness of the liquid film of the to-be-cleaned surface 21 in the radial direction may tend to be uniform. Meanwhile, different liquid inlet pipelines 41 may be switched by instantly opening and closing the on/off valves, which may reduce the time delay of the changes in the concentrations and/or temperatures of the cleaning liquids sprayed from the spray head 40. Therefore, the uniformity of the concentration and/or temperature of the cleaning liquid in the radial direction of the to-be-cleaned surface may be accurately controlled.

For example, as shown in FIG. 3, the spray assembly includes three liquid inlet pipelines 41, which include a first liquid inlet pipeline 41A, a second liquid inlet pipeline 41B, and a third liquid inlet pipeline 41C, respectively. In addition, a first on/off valve 43A, a second on/off valve 43B, and a third on/off valve 43C are arranged in the first inlet pipeline 41A, the second inlet pipeline 41B, and the third inlet pipeline 41C, respectively. Under this situation, the concentrations and/or temperatures of the cleaning liquids in the first liquid inlet pipeline 41A, the second liquid pipe 41B, and the third liquid pipe 41C may be set to decrease in an order of reference numbers. When the drive source 30 drives the spray head 40 to move back and forth from the edge to the center of the to-be-cleaned surface 21, the on/off valves (43A-43C) of the three liquid inlet pipelines (41A-41C) may be opened in order. Each time an on/off valve in a liquid inlet pipeline is opened, an on/off valve in a last liquid inlet pipeline that is opened may be closed to ensure that only an on/off valve of one inlet pipeline is opened.

On the contrary, when the drive source 30 drives the spray head 40 to move back and forth from the center to the edge of the to-be-cleaned surface 21, the on/off valve in the corresponding liquid inlet pipeline 41 may be sequentially opened according to the concentrations and/or temperatures of the cleaning liquids in the order of from low to high. An opening of an on/off valve of only one of the multiple liquid inlet pipelines 41 may be always maintained. Thus, the concentration and/or the temperature of the cleaning liquid may be increased from the center to the edge of the to-be-cleaned surface 21.

In some embodiments, the predetermined rule may also include as follows. When the spray head 40 rotates back and forth between the edge and the center of to-be-cleaned surface 21, by switching the number of the on/off valves that are opened, the flow rate of the cleaning liquid sprayed from the spray head 40 may be adjusted. Thus, the spray head 40 may spray the cleaning liquids with different flow rates corresponding to different positions in the radial direction of the to-be-cleaned surface. The cleaning rate of the cleaning liquid at different positions in the radial direction of the to-be-cleaned surface may be consistent. In addition, since the flow rates of the cleaning liquids sprayed by the spray head 40 are adjusted by switching among different liquid inlet pipelines, compared to a manner of adjusting the flow rate by a flow control valve, a delay of the flow rate adjustment may not exist. Therefore, the feedback rate and the precision of the flow rate control may be improved.

In some embodiments, when the drive source 30 drives the spray head 40 to move from the edge to the center of to-be-cleaned surface 21, the number of the on/off valves that are opened gradually decreases. As such, the flow rates of the cleaning liquids may be reduced from the edge to the center of the to-be-cleaned surface 21. Thus, the difference in the thickness of the liquid film of the to-be-processed workpiece 20 caused by the difference of the linear velocity in the radial direction may be compensated. In addition, the thickness of the liquid film in the radial direction of the to-be-cleaned surface 21 may tend to be uniform.

Taking the three liquid inlet pipelines (41A to 41C) shown in FIG. 4 as an example, when the drive source 30 drives the spray head 40 to move from the edge to the center of to-be-cleaned surface 21, three operations of the on/off valves may be performed. When the on/off valves are operated for a first time, a number x is 3, that is, the on/off valves (43A-43C) of the three liquid inlet pipelines 41 are opened simultaneously. At this point, the flow rate of the cleaning liquid sprayed by the spray head 40 is the largest. When the on/off valves are operated for a second time, the number x is 2, that is, the on/off valves of two liquid inlet pipelines 41 are opened simultaneously. At this point, the flow rate of the cleaning liquid sprayed by the spray head 40 is reduced relative to the flow rate when the on/off valves are operated for the first time. When the on/off valves are operated for a third time, the number x is 1, that is, an on/off valve of one liquid inlet pipeline 41 is opened. At this point, the flow of the cleaning liquid sprayed by the spray head 40 is the smallest.

Oppositely, when the drive source 30 drives the spray head 40 to move from the edge to the center of to-be-cleaned surface 21, the number x of the on/off valves that are opened gradually increases. Thus, the flow rates of the cleaning liquids may be increased from the center to the edge of the to-be-cleaned surface 21.

In some embodiments, the spray head 40 may include one liquid spray hole or a plurality of liquid spray holes.

In some embodiments, another rule may also be used to control the order of opening the on/off valves to sequentially open corresponding liquid inlet pipelines and/or the number of times of switching the on/off valves of corresponding liquid inlet pipelines. As long as, the spray head 40 may spray the cleaning liquids with different concentrations, temperatures, and/or flow rates corresponding to different positions in the radial direction of the to-be-cleaned surface.

Figure 5:
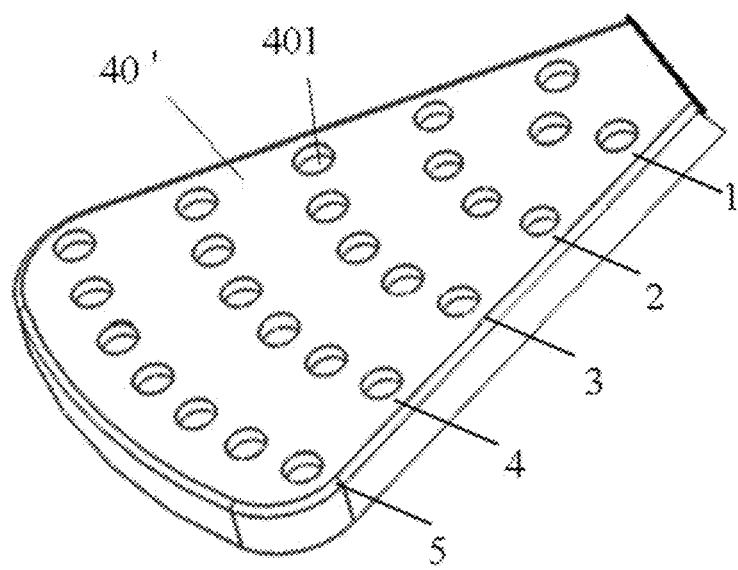
FIG. 5 illustrates a schematic structural diagram of a spray head of a spray device according to some embodiments of the present disclosure.

Referring to FIG. 5, a spray device provided by embodiments of the present disclosure includes a spray assembly.

In some embodiments, the spray assembly includes a spray head 40' and multiple liquid inlet pipelines. The spray head 40' includes a plurality of liquid spray holes 401. The plurality of liquid spray holes 401 are arranged on a plurality of circumferences with different radiuses centered at the center of the to-be-cleaned surface. For example, FIG. 5 shows that the plurality of liquid spray holds 401 are arranged at 5 circumferences (1-5). A number of the liquid inlet pipelines corresponds to a number of the circumferences. The liquid inlet pipelines are arranged in a one-to-one correspondence to the circumferences. The liquid inlet pipelines may be configured to simultaneously provide the cleaning liquid with a different concentration, a different temperature, and/or a different flow rate to spray holes 401 on a corresponding circumference.

Thus, the cleaning liquids sprayed from the different spray holes 401 of the circumferences may have different concentrations, temperatures, and/or flow rates. That is, the spray head 40 may spray the cleaning liquids with different concentrations, temperatures, and/or flow rates corresponding to different positions in the radial direction of the to-be-cleaned surface. In some embodiments, for a larger radius of a circumference, the cleaning liquid with a higher concentration, a higher temperature, and/or a higher flow rate is provided to the liquid inlet pipeline corresponding to the liquid spray holes 401 of the circumference. Therefore, the difference in the thickness of the liquid film of the to-be-processed workpiece caused by the difference in the linear velocity of the film in the radial direction may be compensated. The thickness of the liquid film in the radial direction of the to-be-cleaned surface may tend to be consistent.

In some embodiments, the spray head 40' is fixed and not movable. The plurality of circumferences where the plurality of liquid spray holes 401 are located corresponding to different positions in the radial direction of the to-be-cleaned surface. The spray holes 401 located at the different circumferences spray the cleaning liquids with different concentrations, temperatures, and/or flow rates. Therefore, the thickness of the liquid film in the radial direction of the to-be-cleaned surface may tend to be consistent.

In practical applications, diameters of the plurality of liquid spray holes 401 may be same or different. For a larger radius of a circumference, the diameters of spray holes 401 on the circumference are larger. Thus, the flow rates of the sprayed cleaning liquids may gradually decrease from the edge to the center of the to-be-cleaned surface. Under the situation, one liquid inlet pipeline may be included, which may be configured to provide the cleaning liquid to all the liquid spray holes. In some embodiments, the multiple liquid inlet pipelines may be included. The flow rates of the cleaning liquids provided by the liquid inlet pipelines to the liquid spray holes 401 at the circumferences corresponding to the liquid inlet pipelines may be same or different.

In summary, the spray device provided by embodiments of the present disclosure may spray the cleaning liquid towards the to-be-cleaned surface of the to-be-processed workpiece through the spray assembly. The spray assembly may be configured to spray the cleaning liquids with different concentrations, temperatures, and/or flow rates corresponding to different positions in the radial direction of the to-be-cleaned surface. Thus, the cleaning rates of the cleaning liquids at the different positions in the radial direction of the to-be-cleaned surface may be consistent to improve the cleaning uniformity. Meanwhile, the bumps, which are formed because the thickness of the liquid film is too small, may be avoided. Thus, the product yield may be improved. In addition, the changes in the concentration, temperature, and/or flow rate of the cleaning liquid greatly impact the cleaning rate. Therefore, the feedback rate may be increased.

As another technical solution, embodiments of the present disclosure also provide a cleaning apparatus. The cleaning apparatus may include a carrier configured to carry the to-be-processed workpiece and a spray device configured to clean the to-be-cleaned surface of the to-be-processed workpiece. The spray device includes the spray device provided by embodiments of the present disclosure.

The present disclosure provides a cleaning apparatus. The cleaning uniformity and the product yield may be increased by using the spray device provided by embodiments of the present disclosure.

Above embodiments are merely exemplary embodiments used to illustrate the principle of the present disclosure. However, the present disclosure is not limited to this. For those of ordinary skill in the art, various modifications and improvements can be made without departing from the spirit and essence of the present disclosure. These modifications and improvements are within the scope of the present disclosure.

What is claimed is:

1. A spray device, comprising:
a spray assembly configured to spray cleaning liquid towards a to-be-cleaned surface of a to-be-processed workpiece, wherein:
the spray assembly includes:
a spray head, driven by a drive source and having an end movable between an edge and a center of the to-be-cleaned surface,
a plurality of liquid inlet pipelines connected to the spray head, and
an on/off valve arranged in each liquid inlet pipeline to control cleaning liquids sprayed,
wherein the spray assembly is configured to spray cleaning liquids with different concentrations, temperatures, and/or flow rates corresponding to different positions in a radial direction of the to-be-cleaned surface to thereby cause a thickness of a liquid film in the radial direction of the to-be-cleaned surface of the cleaning liquid to be consistent and a cleaning rate of the cleaning liquids at the different positions in the radial direction of the to-be-cleaned surface to be consistent.

2. The spray device according to claim 1, wherein:
the plurality of liquid inlet pipelines are connected to the spray head at a plurality of different locations on a surface of the spray head;
the drive source is configured to drive the spray head to move during rotation of the to-be-processed workpiece; and
the on/off valve arranged in each liquid inlet pipeline is controlled by a predetermined rule regarding an order of opening on/off valves of corresponding liquid inlet pipelines and/or number of times for switching on/off valves of corresponding liquid inlet pipelines during a movement of the spray head.

3. The spray device according to claim 2, wherein the predetermined rule includes:
providing the cleaning liquids to the plurality of liquid inlet pipelines with different concentrations and/or different temperatures; and
during the movement of the spray head:
opening the on/off valves according to a predetermined order; and
always maintaining an opening of an on/off valve of only one of the plurality of liquid inlet pipelines, wherein the cleaning liquids sprayed at different positions in the radial direction of the to-be-cleaned surface have different concentrations and/or different temperatures.

4. The spray device according to claim 3, wherein the predetermined order includes:
in response to the drive source driving the spray head to move from the edge to the center of the to-be-cleaned surface, sequentially opening the on/off valves of corresponding liquid inlet pipelines according to the concentrations and/or temperatures of the cleaning liquids in an order of from high to low; and
in response to the drive source driving the spray head to move from the center to the edge of the to-be-cleaned surface, sequentially opening the on/off valves of the corresponding liquid inlet pipelines according to the concentrations and/or temperatures of the cleaning liquid in an order of from low to high.

5. The spray device according to claim 2, wherein the predetermined rule includes:
in response to the drive source driving the spray head to move from the edge to the center of the to-be-cleaned surface, gradually decreasing a quantity of the on/off valves that are opened; and
in response to the drive source driving the spray head to move from the center to the edge of the to-be-cleaned surface, gradually increasing a quantity of the on/off valves that are opened.

6. The spray device according to claim 2, wherein the drive source is a rotation drive source and configured to drive the spray head to swing back and forth between the edge and the center of the to-be-cleaned surface.

7. The spray device according to claim 6, wherein the rotation drive source includes:
a drive arm arranged vertically on a side of a carrier that is configured to carry the to-be-processed workpiece, the spray head being arranged on the drive arm and located over the carrier; and
a rotation motor configured to drive the drive arm to rotate at a predetermined angle clockwise or counterclockwise.

8. The spray device according to claim 1, wherein:
the spray head includes a plurality of liquid spray holes, the plurality of liquid spray holes being arranged at a plurality of circumferences of different radiuses centered on a center of the to-be-cleaned surface; and
the plurality of liquid inlet pipelines are arranged in a one-to-one correspondence to the plurality of circumferences, a number of the plurality of liquid inlet pipelines corresponding to a number of the plurality of circumferences, and each of the plurality of liquid inlet pipelines being configured to provide the cleaning liquid with a different concentration, a different temperature, and/or a different flow rate to liquid spray holes of a corresponding circumference.

9. The spray device according to claim 8, wherein for a larger radius of the circumference, the cleaning liquid with a higher concentration, a higher temperature, and/or a higher flow rate is provided to the liquid inlet pipeline corresponding to the liquid spray holes of the circumference.

10. The spray device according to claim 1, wherein:
the spray head includes a plurality of liquid spray holes, the plurality of liquid spray holes being arranged at a plurality of circumferences of different radiuses centered at a center of the to-be-cleaned surface, for a larger radius of a circumference, the diameters of liquid spray holes of the circumference being larger; and
each liquid inlet pipeline is configured to provide the cleaning liquids to all of the liquid spray holes simultaneously.

11. A cleaning apparatus, comprising:
a carrier configured to carry a to-be-processed workpiece; and
a spray device configured to clean a to-be-cleaned surface of the to-be-processed workpiece, including:
a spray assembly configured to spray cleaning liquid towards the to-be-cleaned surface of the to-be-processed workpiece, wherein:
the spray assembly includes:
a spray head, driven by a drive source and having an end movable between an edge and a center of the to-be-cleaned surface,
a plurality of liquid inlet pipelines connected to the spray head, and
an on/off valve arranged in each liquid inlet pipeline to control cleaning liquids sprayed,
wherein the spray assembly is configured to spray cleaning liquids with different concentrations, temperatures, and/or flow rates corresponding to different positions in a radial direction of the to-be-cleaned surface to thereby cause a thickness of a liquid film in the radial direction of the to-be-cleaned surface of the cleaning liquid to be consistent and a cleaning rate of the cleaning liquids at the different positions in the radial direction of the to-be-cleaned surface to be consistent.

12. The cleaning apparatus according to claim 11, wherein:
the plurality of liquid inlet pipelines are connected to the spray head at a plurality of different locations on a surface of the spray head;
the drive source is configured to drive the spray head to move during rotation of the to-be-processed workpiece; and
the on/off valve arranged in each liquid inlet pipeline is controlled by a predetermined rule regarding an order of opening on/off valves of corresponding liquid inlet pipelines and/or number of times for switching on/off valves of corresponding liquid inlet pipelines during a movement of the spray head.

13. The cleaning apparatus according to claim 12, wherein the predetermined rule includes:
providing the cleaning liquids to the plurality of liquid inlet pipelines with different concentrations and/or temperatures; and
during the movement of the spray head:
opening the on/off valves according to a predetermined order; and
always maintaining an opening of an on/off valve of only one of the plurality of liquid inlet pipelines, wherein the cleaning liquids sprayed at different positions in the radial direction of the to-be-cleaned surface have different concentrations and/or different temperatures.

14. The cleaning apparatus according to claim 13, wherein the predetermined order includes:
in response to the drive source driving the spray head to move from the edge to the center of the to-be-cleaned surface, sequentially opening the on/off valves of corresponding liquid inlet pipelines according to the concentrations and/or temperatures of the cleaning liquids in an order of from high to low; and
in response to the drive source driving the spray head to move from the center to the edge of the to-be-cleaned surface, sequentially opening the on/off valves of the corresponding liquid inlet pipelines according to the concentrations and/or temperatures of the cleaning liquids in an order of from low to high.

15. The cleaning apparatus according to claim 12, wherein the predetermined rule includes:
in response to the drive source driving the spray head to move from the edge to the center of the to-be-cleaned surface, gradually decreasing a quantity of the on/off valves that are opened; and
in response to the drive source driving the spray head to move from the center to the edge of the to-be-cleaned surface, gradually increasing a quantity of the on/off valves that are opened.

16. The cleaning apparatus according to claim 12, wherein the drive source is a rotation drive source and configured to drive the spray head to swing back and forth between the edge and the center of the to-be-cleaned surface.

17. The cleaning apparatus according to claim 16, wherein the rotation drive source includes:
   a drive arm arranged vertically on a side of the carrier, the spray head being arranged on the drive arm and located over the carrier; and
   a rotation motor configured to drive the drive arm to rotate at a predetermined angle clockwise or counterclockwise.

18. The cleaning apparatus according to claim 11, wherein:
   the spray head includes a plurality of liquid spray holes, the plurality of liquid spray holes being arranged at a plurality of circumferences of different radiuses centered on a center of the to-be-cleaned surface; and
   the plurality of liquid inlet pipelines are arranged in a one-to-one correspondence to the plurality of circumferences, a number of the plurality of liquid inlet pipelines corresponding to a number of the plurality of circumferences, and each of the plurality of liquid inlet pipelines being configured to provide the cleaning liquid with a different concentration, a different temperature, and/or a different flow rate to liquid spray holes of a corresponding circumference.

19. The cleaning apparatus according to claim 18, wherein for a larger radius of the circumference, the cleaning liquid with a higher concentration, a higher temperature, and/or a higher flow rate is provided to the liquid inlet pipeline corresponding to the liquid spray holes of the circumference.

20. The cleaning apparatus according to claim 11, wherein:
   the spray head includes a plurality of liquid spray holes, the plurality of liquid spray holes being arranged at a plurality of circumferences of different radiuses centered at a center of the to-be-cleaned surface, for a larger radius of a circumference, the diameters of liquid spray holes of the circumference being larger; and
   each liquid inlet pipeline is configured to provide the cleaning liquids to all of the liquid spray holes simultaneously.

* * * * *